United States Patent [19]

Sandhu et al.

[11] Patent Number: 5,139,974
[45] Date of Patent: Aug. 18, 1992

[54] SEMICONDUCTOR MANUFACTURING PROCESS FOR DECREASING THE OPTICAL REFELCTIVITY OF A METAL LAYER

[75] Inventors: Gurtej S. Sandhu; Chang Yu; Yauh-Ching Liu, all of Boise, Id.

[73] Assignee: Micron Technology, Inc., Boise, Id.

[21] Appl. No.: 645,573

[22] Filed: Jan. 25, 1991

[51] Int. Cl.$^5$ .......................................... H01L 21/302
[52] U.S. Cl. ...................................... 437/228; 437/245;
437/977; 437/946; 204/192.28; 204/192.3;
156/665
[58] Field of Search ............... 437/228, 245, 946, 977,
437/229; 148/DIG. 51, 138; 204/192.25,
192.26, 192.28, 192.3; 156/665

[56] References Cited

U.S. PATENT DOCUMENTS

| | | | |
|---|---|---|---|
| 3,984,300 | 10/1976 | Van Ommeren | 204/192 |
| 4,523,372 | 6/1985 | Balda et al. | 29/590 |
| 4,933,304 | 6/1990 | Chen et al. | 148/DIG. 138 |

OTHER PUBLICATIONS

Arnold Aronson, "The Art of Sputtering Process Development", Process Equipment Division Materials Research Corporation.

Michael Roche and Manfred Schneegans, "Titanium Nitride for Antireflection Control", J. Vac Sci Technology B 6(4) Jul./Aug. 1988.

*Primary Examiner*—Olik Chaudhuri
*Assistant Examiner*—Andrew Griffis
*Attorney, Agent, or Firm*—Nydegger & Associates

[57] ABSTRACT

A semiconductor manufacturing process for increasing the optical absorptivity and decreasing the optical reflectivity of a metal film in order to reduce the effect of reflective notching and widen the process exposure window for photolithographic patterning. A metal film to be photopatterned is first deposited on a substrate and is then roughened to increase the surface area and to provide an irregular surface for reabsorbing scattered light. Surface roughening may be accomplished by dry etching or by simple ion bombardment during a reverse sputtering process. A second metal layer may also be deposited upon the roughened surface by sputter deposition to achieve a desired surface roughness.

13 Claims, 1 Drawing Sheet

SEMICONDUCTOR MANUFACTURING PROCESS FOR DECREASING THE OPTICAL REFELCTIVITY OF A METAL LAYER

FIELD OF THE INVENTION

This invention relates to semiconductor manufacture and, more particularly, to a process in which the surface of a metal layer is roughened in order to increase the optical absorptivity and decrease the optical reflectivity of the surface to widen the process window for photolithography and avoid reflective notching.

BACKGROUND OF THE INVENTION

As silicon technology advances to ultra-large scale integration (ULSI), the devices on Si wafers shrink to sub-micron dimension and the circuit density increases to several million transistors per die. In order to accomplish this high device packing density, smaller and smaller feature sizes are required. This may include the width and spacing of interconnecting lines and the surface geometry such as corners and edges, of various features.

The requirement of small feature sizes with close spacing between adjacent features requires high resolution photolithographic processes. A problem that occurs during photolithography of a semiconductor wafer is caused by the reflectivity of a layer to be photopatterned. High reflectivity of aluminum alloy layers, for instance, causes degradation to occur in photoresist images through reflective light scattering.

In the past, one solution to this problem has been by the use of anti-reflective coatings (ARC). A film of amorphous silicon, for example, can be applied as an antireflection layer on top of a silicon substrate. Another example is the use of Ti and TiN over AlSi. These methods while useful also present certain process limitations. In particular, the use of an antireflective coating requires additional process steps. The antireflective coating must be accurately deposited in an optimal thickness and must be removed after photolithography. Moreover, some antireflective coatings may cause photoresist adhesion problems.

The present invention is directed to a process for increasing the optical absorptivity and decreasing the optical reflectivity of a metal layer in order to avoid reflective notching during photolithography.

SUMMARY OF THE INVENTION

In accordance with the present invention, a novel process for increasing the optical absorptivity and decreasing the optical reflectivity of a metal layer formed on a semiconductor substrate to allow a larger exposure process window for photolithography is provided. The process simply stated involves roughening the surface of the metal layer preferably by dry etching with a reverse sputter etch process so that more light is absorbed by the surface. The increased absorptivity and decreased reflectivity is due to the increased surface area of the roughened surface and to reabsorption of the light by adjacent surface irregularities.

The process of the invention, in general, includes the steps of:
forming a metallic film layer on a semiconductor; and
roughening the surface of the metallic film layer preferably by dry etching by a reverse-sputter etch process to increase the optical absorptivity and decrease the optical reflectivity of the film layer.

A second metal film layer of the same material as the first metallic film may be optionally deposited upon the roughened surface by a process such as sputtering to further increase the absorptivity and decrease the reflectivity of the metallic layer. The second metal film layer is deposited only for a short time upon the roughened surface such that the irregular features of the roughened surface are not completely filled in.

Other objects, advantages, and capabilities of the present invention will become more apparent as the description proceeds.

DETAILED DESCRIPTION OF THE INVENTION

In the manufacture of integrated circuits (ICs), various materials are utilized which are electrically either conductive, insulating, or semiconducting, although the completed semiconductor circuit device itself is usually referred to as a "semiconductor". One of the materials used is silicon, which is used as either single crystal silicon or as polycrystalline silicon material referred to as polysilicon.

The process of the invention simply stated comprises increasing the optical absorptivity and decreasing the optical reflectivity of a metallic film by roughening the surface of the metallic film. It is believed that roughening a metallic surface increases the optical absorptivity and decreases the optical reflectivity by two mechanisms:

1. some of the light scattered by hillocks on the roughened surface will be reabsorbed by adjacent surface irregularities;
2. the total surface area of the metallic film exposed to light will increase giving rise to an increase in the amount of light absorbed by the surface.

The increase in the roughness of the metal surface can be achieved, for example, by in-situ dry etching after metal deposition. The roughening can also be achieved with simple ion bombardment during a reverse sputtering process. It is known in the art that ion bombardment during dry etching produces surface damage. By tailoring the process parameters such as power, pressure, temperature, and reaction chemistry inside a sputter process chamber, it is possible to achieve a high degree of roughness on the surface of metal film without any appreciable etching of the film into the substrate.

Figure 1:
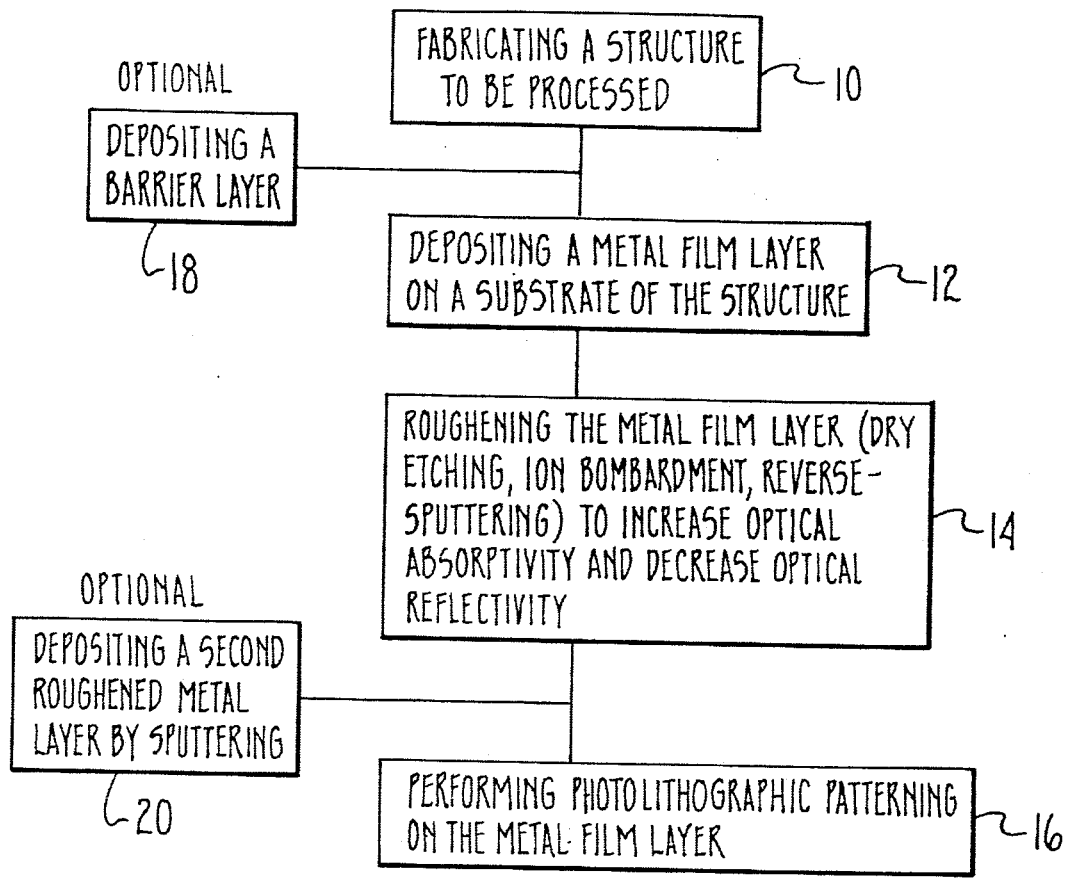
FIG. 1 is a block diagram of the process of the invention.

A representative process sequence of the invention is shown schematically in FIG. 1 and includes the steps of:
fabricating a structure to be processed, step 10;
depositing a layer of metal film upon a substrate of the structure, step 12;
roughening the metal film layer preferably by dry etching, ion bombardment, or reverse-sputtering, step 14; and
performing photolithographic patterning upon the metal film layer, step 16.

The process can be used to increase the optical absorptivity and decrease the optical reflectivity of the film such that a larger process exposure window for photolithography is provided.

In an illustrative embodiment of the invention, the metal film may be Al or an Al alloy such as AlSiCu deposited upon a silicon substrate. Alternately, other metal film layers or substrates may also be utilized for the practice of the invention.

A preferred method of roughening the metal film layer is by in-situ sputter etching. This process is well known in the art of semiconductor manufacture. In general, sputter etching involves the removal of material by ion bombardment. The material to be removed or the underlying substrate may itself serve as a cathode in a gas discharge or be cathodically biased. It is also possible to place the substrate with the layer or layers to be removed locally in the path of the bombarding ions of a gas discharge. Among the process parameters for sputter etching are vacuum pressure, temperature, etch power density, wafer thickness, atmospheric composition, target material, and substrate material. These process parameters may be varied as is known in the art to achieve a desired reaction chemistry and etch rate (i.e. Å per sec.). With the process of the invention, the metal film layer is roughened but is not etched completely through to the surface of the substrate.

The roughening process 14 initially roughens the metal film surface to increase optical absorptivity and decrease the optical reflectivity of the surface. If the etching process proceeds past a certain point, however, the surface reflectivity once again increases. It is believed that this phenomena occurs because sputter etching produces an initial roughening of the surface followed by a gradual smoothening of the surface as additional material is removed. An optimal sputter etching period and rate thus exist.

Effective results may also be achieved by sputter depositing for a short time an additional rough metal layer upon the roughened surface. This additional step of depositing a second roughened metal layer by sputtering is an optional additional step shown as step 20 in FIG. 1. Another optional additional step is to deposit a barrier layer step 18 prior to depositing a metal film layer step 12. The barrier layer is located between the substrate and metal layer to be roughened.

As an additional layer of material is deposited upon the roughened surface by a sputtering process, surface irregularities are initially formed by molecules of the deposited material conforming to the already irregular surface. This causes optical reflectivity to decrease. As the deposition proceeds, however, the irregular features of the roughened surface fill in and optical reflectivity of the surface begins to increase. The process parameters of the deposition must, therefore, be controlled to achieve a desired surface roughness. One measure of an optimal surface roughness is by measuring the reflectivity of the surface as compared to the reflectivity of a smooth film surface. The inventors have conducted experiments to ascertain process parameters which decrease the reflectivity of the metal film layer to approximately 50%.

The following table, Table 1, illustrates the results achieved with the process of the invention in which the process was performed in accordance with steps 10, 12, 14, and 16 (FIG. 1) along with optional additional steps 18 and 20. The metal film layer was formed of AlSiCu deposited on a silicon substrate. The silicon substrate was heated to a temperature of 300° C.

A total of nine separate experiments were performed. In each experiment, a metal film of AlSiCu was first deposited upon a silicon substrate. The surface was then sputter etched for a short period (i.e. 10–30 secs.). This time was necessary to roughen the surface of the metal film without breaking through to the surface of the substrate. A second metal film layer (Al) was then sputter deposited upon the roughened initial layer and the reflectivity of the resultant surface was measured.

TABLE 1

Process Parameters VERSUS Resultant Reflectivity of AlSi (1%) Cu (0.5%)

| | Sputter Etch Step 14 | | Second Al Deposition (10 to 100Å) Step 20 | | |
|---|---|---|---|---|---|
| Exp # | Etch Power (2 KW MAX) | Etch Time (Sec) | Power (2 KW MAX) | Time (Sec) | Reflectivity |
| 1 | 20% | 20 | 20% | 1.0 | 77% |
| 2 | 20% | 20 | 20% | 1.5 | 59% |
| 3 | 20% | 20 | 20% | 2.0 | 62% |
| 4 | 20% | 20 | 20% | 4.0 | 53% |
| 5 | 20% | 20 | 20% | 10.0 | 62% |
| 6 | 20% | 10 | 20% | 4.0 | 61% |
| 7 | 20% | 30 | 20% | 1.5 | 71% |
| 8 | 50% | 20 | 20% | 2.0 | 90% |
| 9 | 20% | 20 | 90% | 1.5 | 91% |

Substrate temperature during sputter etch and second Al deposition was 300° C.

As shown in Table 1, optimal results were obtained in experiment 4 in which the initial film was roughened by a sputter etch of twenty seconds followed by sputter deposition of a second film of Al for four seconds. This process produced a reflectivity of the film of 53%. This compares to the reflectivity of a smooth film which is approximately 92%.

Figure 2:
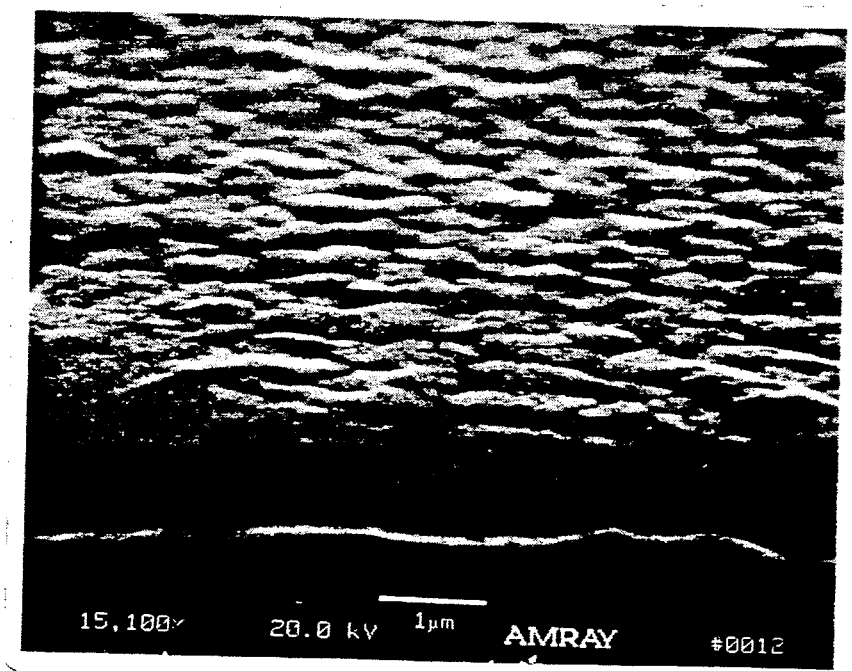
FIG. 2 is a photomicrograph (15,100×) of an Al alloy film deposited onto a substrate and roughened in accordance with the process of the invention to increase optical absorptivity and decrease optical reflectivity in order to promote a larger exposure window for photolithography.

FIG. 2 is a photomicrograph showing the surface of a metal film after processing in accordance with the invention. As is apparent from a close inspection, the surface includes discernable hillocks having random lengths of less than approximately 1 μm and a height≈ thickness of approximately 0.25 μm. This roughened surface provides surface irregularities and an increased total surface area for increasing the optical absorptivity and decreasing the reflectivity of the metal film layer.

Thus, the invention provides a simple but unobvious method for decreasing the optical reflectivity and increasing the optical absorptivity of a metal film layer in a semiconductor manufacturing process. This can be used to provide a larger process exposure window for a subsequent photolithography process. With the process of the invention there is no need for a subsequent removal process step as is required with the use of antireflective coatings.

What has been described are very specific steps in conjunction with preferred embodiments and applications of the invention. As will be apparent to those skilled in the art, however, other steps may be taken within the scope of the invention in order to accomplish substantially the same results. Accordingly, the invention should be read only as limited by the claims.

What is claimed is:

1. A semiconductor manufacturing process comprising:

fabricating a semiconductor structure to be processed;

depositing a metal film layer on a substrate of the structure;

roughening the metal film layer in situ in a vacuum process chamber using a sputter etch process for a time sufficient to roughen a surface of the metal film layer but not etch through to the substrate in order to decrease the optical reflectivity and increase the optical absorptivity to widen the exposure window for photolithography; and performing photolithographic patterning of the metal surface.

2. A process as recited in claim 1 and further comprising:

depositing a second metal layer upon the roughened surface by a sputtering process.

3. A process as recited in claim 2 and wherein:

a barrier layer is deposited on the substrate prior to depositing the metal film layer.

4. A process as recited in claim 2 wherein:

the second metal layer is sputter deposited for a short time necessary to decrease reflectivity prior to an increase in reflectivity.

5. A process as recited in claim 4 and wherein:

the second metal layer has a thickness of from 10 to 100Å.

6. A process as recited in claim 4 and wherein:

the sputter etch process is performed with an etch power of about 20% of a maximum power of about 2 KW for about 20 seconds and a second metal deposition is at a power of about 20% of a maximum power of about 2 KW for about four seconds.

7. The process as recited in claim 6 and wherein:

the roughened surface is formed with hillocks having a length of less than approximately 1 μm and a width approximately equal to a thickness of approximately 0.25 μm.

8. A semiconductor manufacturing process comprising:

fabricating a semiconductor structure to be processed;

depositing a metal film layer on a substrate of the structure;

roughening the metal film layer in situ in a vacuum process chamber by dry etching for a time sufficient to roughen a surface of the metal film layer but not etch through to the substrate in order to provide an increased surface area for light absorption and an irregular surface for reabsorbing scattered light in order to increase optical absorptivity and decrease optical reflectivity for widening an exposure window for photolithographic patterning; and performing photolithographic patterning of the metal layer.

9. The process as recited in claim 8 and wherein:

roughening is accomplished by ion bombardment during a reverse sputtering process.

10. The process as recited in claim 9 and wherein:

a second metal layer is sputter deposited upon the roughened metal layer.

11. The process as recited in claim 10 and wherein:

a second metal layer having a thickness of from about 10 to 100Å is deposited upon the roughened surface by sputter deposition.

12. The process as recited in claim 10 and wherein:

the metal layer is an Al alloy of AlSi (1%) Cu (5%) and the second metal layer is selected from a class consisting of Al or an Al alloy.

13. The process as recited in claim 11 and wherein:

process parameters are controlled to reduce the optical reflectivity of the metal layer to approximately 53%.

* * * * *